United States Patent
Davies et al.

(10) Patent No.: US 10,965,386 B1
(45) Date of Patent: Mar. 30, 2021

(54) SYSTEM AND METHOD FOR CALIBRATING ANTENNA ARRAY

(71) Applicant: Rockwell Collins, Inc., Cedar Rapids, IA (US)

(72) Inventors: Orion Davies, Cedar Rapids, IA (US); Shajid Islam, Norman, OK (US); Connor C. McBryde, Marion, IA (US); Trevor Trinkaus, Melbourne, FL (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 16/811,085

(22) Filed: Mar. 6, 2020

(51) Int. Cl.
*H04B 17/12* (2015.01)
*H04B 17/10* (2015.01)

(52) U.S. Cl.
CPC ............ *H04B 17/12* (2015.01); *H04B 17/102* (2015.01)

(58) Field of Classification Search
CPC .............................. H04B 17/102; H04B 17/12
See application file for complete search history.

(56) References Cited

U.S. PATENT DOCUMENTS

| | | | | |
|---|---|---|---|---|
| 6,597,678 B1 * | 7/2003 | Kuwahara | ............ | H01Q 3/2605 370/335 |
| 7,231,007 B2 * | 6/2007 | Artamo | ............ | H04B 7/0857 375/347 |
| 8,576,937 B2 * | 11/2013 | Han | ............ | H04B 7/0417 375/267 |
| 9,444,535 B2 * | 9/2016 | Dinan | ............ | H04W 36/0055 |
| 10,571,503 B2 | 2/2020 | Paulsen et al. | | |
| 2004/0214604 A1 * | 10/2004 | Yoon | ............ | H01Q 3/267 455/562.1 |
| 2009/0257423 A1 * | 10/2009 | Kwon | ............ | H04B 7/0626 370/345 |

(Continued)

OTHER PUBLICATIONS

Silverstein, Seth D., "Application of Orthogonal Codes to the Calibration of Active Phased Array Antennas for Communication Satellites", IEEE Transactions on Signal Processing, vol. 45, No. 1, Jan. 1997, pp. 206-218.

*Primary Examiner* — Dominic E Rego
(74) *Attorney, Agent, or Firm* — Suiter Swantz pc llo

(57) ABSTRACT

A system may include a processor and an antenna array including antenna radiating elements. The processor may be configured to: receive first, second, third, and fourth measurement coding matrixes; calculate a reference encoding matrix with coherent signal leakage de-embedded by subtracting the fourth measurement coding matrix from the third measurement coding matrix; calculate a differential encoding matrix providing twice a signal-to-noise ratio by adding the first measurement coding matrix and the second measurement coding matrix; calculate a differential matrix decoded back to conventional Hadamard matrix by subtracting the differential encoding matrix providing twice a signal-to-noise ratio from the reference encoding matrix with coherent signal leakage de-embedded; calculate complex calibration coefficients for the antenna radiating elements by multiplying an inverse Hadamard matrix by the differential matrix decoded back to conventional Hadamard matrix; and program the antenna array with amplitude and phase offsets computed from the complex calibration coefficients.

15 Claims, 11 Drawing Sheets

(56) References Cited

U.S. PATENT DOCUMENTS

| | | | | |
|---|---|---|---|---|
| 2009/0285325 | A1* | 11/2009 | Zhou | H04L 27/2608 375/267 |
| 2010/0166099 | A1* | 7/2010 | Sari | H04L 1/0637 375/267 |
| 2011/0133988 | A1* | 6/2011 | Fukagawa | G01S 3/46 342/442 |
| 2013/0064317 | A1* | 3/2013 | Tong | H04B 7/0469 375/267 |
| 2013/0094548 | A1* | 4/2013 | Park | H04B 7/0473 375/219 |
| 2013/0114755 | A1* | 5/2013 | Cheng | H04B 7/0456 375/295 |
| 2013/0315081 | A1* | 11/2013 | Kim | H04W 72/042 370/252 |
| 2015/0350942 | A1* | 12/2015 | Wei | H04W 72/08 370/330 |
| 2016/0028447 | A1* | 1/2016 | Etkin | H04B 7/0456 455/561 |
| 2017/0302480 | A1* | 10/2017 | Kim | H04B 7/06 |
| 2018/0080967 | A1* | 3/2018 | Lee | G01R 29/10 |
| 2018/0184441 | A1* | 6/2018 | Faxer | H04B 7/0456 |
| 2018/0262244 | A1* | 9/2018 | Noh | H04B 7/0469 |
| 2019/0081669 | A1* | 3/2019 | Wu | H04B 7/10 |
| 2019/0089441 | A1* | 3/2019 | Sivahumaran | H04L 25/0204 |
| 2019/0149250 | A1* | 5/2019 | Jidhage | H04B 17/19 455/101 |
| 2020/0076073 | A1 | 3/2020 | Hill et al. | |
| 2020/0274627 | A1* | 8/2020 | Motoi | H04B 17/29 |

\* cited by examiner

Equation (1): $H_{2^k} = \begin{bmatrix} H_{2^{k-1}} & H_{2^{k-1}} \\ H_{2^{k-1}} & -H_{2^{k-1}} \end{bmatrix}$ Equation (2): $H_2 = \begin{bmatrix} 1 & 1 \\ 1 & -1 \end{bmatrix}$ Equation (3): $HH^T = nI_n$ Equation (4): $H_4 = \begin{bmatrix} 1 & 1 & 1 & 1 \\ 1 & -1 & 1 & -1 \\ 1 & 1 & -1 & -1 \\ 1 & -1 & -1 & 1 \end{bmatrix}$ Equation (5): $H_4 = \begin{bmatrix} ae^{\frac{jn\pi}{4}} & ae^{\frac{jn\pi}{4}} & ae^{\frac{jn\pi}{4}} & ae^{\frac{jn\pi}{4}} \\ ae^{\frac{jn\pi}{4}} & ae^{\frac{jn\pi}{4}} & ae^{\frac{jn\pi}{4}} & ae^{\frac{jn\pi}{4}} \\ ae^{\frac{jn\pi}{4}} & ae^{\frac{jn\pi}{4}} & ae^{\frac{jn\pi}{4}} & ae^{\frac{jn\pi}{4}} \\ ae^{\frac{jn\pi}{4}} & ae^{\frac{jn\pi}{4}} & ae^{\frac{jn\pi}{4}} & ae^{\frac{jn\pi}{4}} \end{bmatrix}$

FIG.7A

Equation (6): $M_1 = \begin{bmatrix} e^{\frac{j3\pi}{4}} & e^{\frac{j3\pi}{4}} & e^{\frac{j3\pi}{4}} & e^{\frac{j3\pi}{4}} \\ e^{\frac{j3\pi}{4}} & 1 & e^{\frac{j3\pi}{4}} & 1 \\ e^{\frac{j3\pi}{4}} & e^{\frac{j3\pi}{4}} & 1 & 1 \\ e^{\frac{j3\pi}{4}} & 1 & 1 & e^{\frac{j3\pi}{4}} \end{bmatrix} \begin{bmatrix} y_1 \\ y_2 \\ y_3 \\ y_4 \end{bmatrix} = \begin{bmatrix} m_1 \\ m_2 \\ m_3 \\ m_4 \end{bmatrix}$ Equation (7): $M_2 = \begin{bmatrix} e^{\frac{j7\pi}{4}} & e^{\frac{j7\pi}{4}} & e^{\frac{j7\pi}{4}} & e^{\frac{j7\pi}{4}} \\ e^{\frac{j7\pi}{4}} & 1 & e^{\frac{j7\pi}{4}} & 1 \\ e^{\frac{j7\pi}{4}} & e^{\frac{j7\pi}{4}} & 1 & 1 \\ e^{\frac{j7\pi}{4}} & 1 & 1 & e^{\frac{j7\pi}{4}} \end{bmatrix} \begin{bmatrix} y_1 \\ y_2 \\ y_3 \\ y_4 \end{bmatrix} = \begin{bmatrix} m_5 \\ m_6 \\ m_7 \\ m_8 \end{bmatrix}$ Equation (8): $M_3 = \begin{bmatrix} 1 & 1 & 1 & 1 \\ 1 & 1 & 1 & 1 \\ 1 & 1 & 1 & 1 \\ 1 & 1 & 1 & 1 \end{bmatrix} \begin{bmatrix} y_1 \\ y_2 \\ y_3 \\ y_4 \end{bmatrix} = \begin{bmatrix} m_9 \\ m_{10} \\ m_{11} \\ m_{12} \end{bmatrix}$

FIG.7B

Equation (9): $$M_4 = \begin{bmatrix} 0 & 0 & 0 & 0 \\ 0 & 0 & 0 & 0 \\ 0 & 0 & 0 & 0 \\ 0 & 0 & 0 & 0 \end{bmatrix} \begin{bmatrix} y_1 \\ y_2 \\ y_3 \\ y_4 \end{bmatrix} = \begin{bmatrix} m_{13} \\ m_{14} \\ m_{15} \\ m_{16} \end{bmatrix}$$

Equation (10): $$E = \begin{bmatrix} 1 & 1 & 1 & 1 \\ 1 & 1 & 1 & 1 \\ 1 & 1 & 1 & 1 \\ 1 & 1 & 1 & 1 \end{bmatrix} \begin{bmatrix} y_1 \\ y_2 \\ y_3 \\ y_4 \end{bmatrix} = \begin{bmatrix} m_9 - m_{13} \\ m_{10} - m_{14} \\ m_{11} - m_{15} \\ m_{12} - m_{16} \end{bmatrix}$$

Equation (11): $$F = \begin{bmatrix} 0 & 0 & 0 & 0 \\ 0 & 2 & 0 & 2 \\ 0 & 0 & 2 & 2 \\ 0 & 2 & 2 & 0 \end{bmatrix} \begin{bmatrix} y_1 \\ y_2 \\ y_3 \\ y_4 \end{bmatrix} = \begin{bmatrix} m_1 + m_5 \\ m_2 + m_6 \\ m_3 + m_7 \\ m_4 + m_8 \end{bmatrix}$$

Equation (12): $$G = \begin{bmatrix} 1 & 1 & 1 & 1 \\ 1 & -1 & 1 & -1 \\ 1 & 1 & -1 & -1 \\ 1 & -1 & -1 & 1 \end{bmatrix} \begin{bmatrix} y_1 \\ y_2 \\ y_3 \\ y_4 \end{bmatrix} = \begin{bmatrix} m_9 - m_{13} - m_1 - m_5 \\ m_{10} - m_{14} - m_2 - m_6 \\ m_{11} - m_{15} - m_3 - m_7 \\ m_{12} - m_{16} - m_4 - m_8 \end{bmatrix}$$

FIG.7C

Equation (13): $\begin{bmatrix} y_1 \\ y_2 \\ y_3 \\ y_4 \end{bmatrix} = H^{-1} \times \begin{bmatrix} m_9 - m_{13} - m_1 - m_5 \\ m_{10} - m_{14} - m_2 - m_6 \\ m_{11} - m_{15} - m_3 - m_7 \\ m_{12} - m_{16} - m_4 - m_8 \end{bmatrix}$

FIG.7D

SYSTEM AND METHOD FOR CALIBRATING ANTENNA ARRAY

CROSS-REFERENCE TO RELATED APPLICATIONS

The present application is related to U.S. patent application Ser. No. 16/147,457, filed Sep. 8, 2018, which claims priority to U.S. Patent Application No. 62/725,857, filed Aug. 31, 2018, which are incorporated by reference in their entirety.

BACKGROUND

Antenna technology is rapidly progressing in the area of antenna arrays (e.g., active phased array antennas, commonly referred to as electronically steered antennas (ESAs)), that employ either digital or analog beamforming technologies to control the gain and phase settings of individual antenna elements (e.g., radiating elements) in order to electronically steer the resulting beam.

This physical arrangement of many small beam forming devices in a single system allows for functionality that previously required larger passive (e.g., slotted waveguide) antennas, accompanied by mechanical hardware, to physically point the antenna at a target location. Among other advantages in signal processing (such as dual polarization and utilizing multiple beams) this technology also improves control over directionality, which leads to improvement in Low Probability of Intercept (LPI) and Low Probability of Detection (LPD).

Along with this new technology comes new challenges for system calibration of ESAs. Calibration is a necessary process for accurate performance and compensation of manufacturing variations.

Existing methods to calibrate ESAs use Near Field (NF) and Far Field (FF) approaches. Both of these require anechoic chambers of significant facility size with accurate positioning systems to translate receiver and emitter sources (e.g., an electromagnetic field probe) across known coordinate space relative to the ESA. Both are time consuming processes to complete.

SUMMARY

In one aspect, embodiments of the inventive concepts disclosed herein are directed to a system. The system may include an antenna array including antenna radiating elements. The system may further include a processor communicatively coupled to the antenna array. The processor may be configured to: use a generalized form of Hadamard Codes to perform measurements of the antenna radiating elements, the generalized form of Hadamard Codes including amplitude coefficients and phase coefficients for the antenna radiating elements; receive a first set of measurements of the antenna radiating elements as a first measurement coding matrix; receive a second set of measurements of the antenna radiating elements as a second measurement coding matrix; receive a third set of measurements of the antenna radiating elements as a third measurement coding matrix, wherein the third measurement coding matrix corresponds to all of the antenna radiating elements being in a powered on state; receive a fourth set of measurements of the antenna radiating elements as a fourth measurement coding matrix, wherein the fourth measurement coding matrix corresponds to all of the antenna radiating elements being in a powered down state; calculate a reference encoding matrix with coherent signal leakage de-embedded by subtracting the fourth measurement coding matrix from the third measurement coding matrix; calculate a differential encoding matrix providing twice a signal-to-noise ratio by adding the first measurement coding matrix and the second measurement coding matrix; calculate a differential matrix decoded back to conventional Hadamard matrix by subtracting the differential encoding matrix providing twice a signal-to-noise ratio from the reference encoding matrix with coherent signal leakage de-embedded; calculate complex calibration coefficients for the antenna radiating elements by multiplying an inverse Hadamard matrix by the differential matrix decoded back to conventional Hadamard matrix; and program the antenna array with amplitude and phase offsets computed from the complex calibration coefficients.

In a further aspect, embodiments of the inventive concepts disclosed herein are directed to a method. The method may include: using, by at least one processor communicatively coupled to an antenna array comprising antenna radiating elements, a generalized form of Hadamard Codes to perform measurements of the antenna radiating elements, the generalized form of Hadamard Codes including amplitude coefficients and phase coefficients for the antenna radiating elements; receiving, by the at least one processor, a first set of measurements of the antenna radiating elements as a first measurement coding matrix; receiving, by the at least one processor, a second set of measurements of the antenna radiating elements as a second measurement coding matrix; receiving, by the at least one processor, a third set of measurements of the antenna radiating elements as a third measurement coding matrix, wherein the third measurement coding matrix corresponds to all of the antenna radiating elements being in a powered on state; receiving, by the at least one processor, a fourth set of measurements of the antenna radiating elements as a fourth measurement coding matrix, wherein the fourth measurement coding matrix corresponds to all of the antenna radiating elements being in a powered down state; calculating, by the at least one processor, a reference encoding matrix with coherent signal leakage de-embedded by subtracting the fourth measurement coding matrix from the third measurement coding matrix; calculating, by the at least one processor, a differential encoding matrix providing twice a signal-to-noise ratio by adding the first measurement coding matrix and the second measurement coding matrix; calculating, by the at least one processor, a differential matrix decoded back to conventional Hadamard matrix by subtracting the differential encoding matrix providing twice a signal-to-noise ratio from the reference encoding matrix with coherent signal leakage de-embedded; calculating, by the at least one processor, complex calibration coefficients for the antenna radiating elements by multiplying an inverse Hadamard matrix by the differential matrix decoded back to conventional Hadamard matrix; and programming, by the at least one processor, the antenna array with amplitude and phase offsets computed from the complex calibration coefficients.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings:

FIGS. 7A, 7B, 7C, 7D show equations, which may be used in an exemplary embodiment of testing and/or calibrating an exemplary antenna array, according to the inventive concepts disclosed herein.

DETAILED DESCRIPTION

Figure 1:
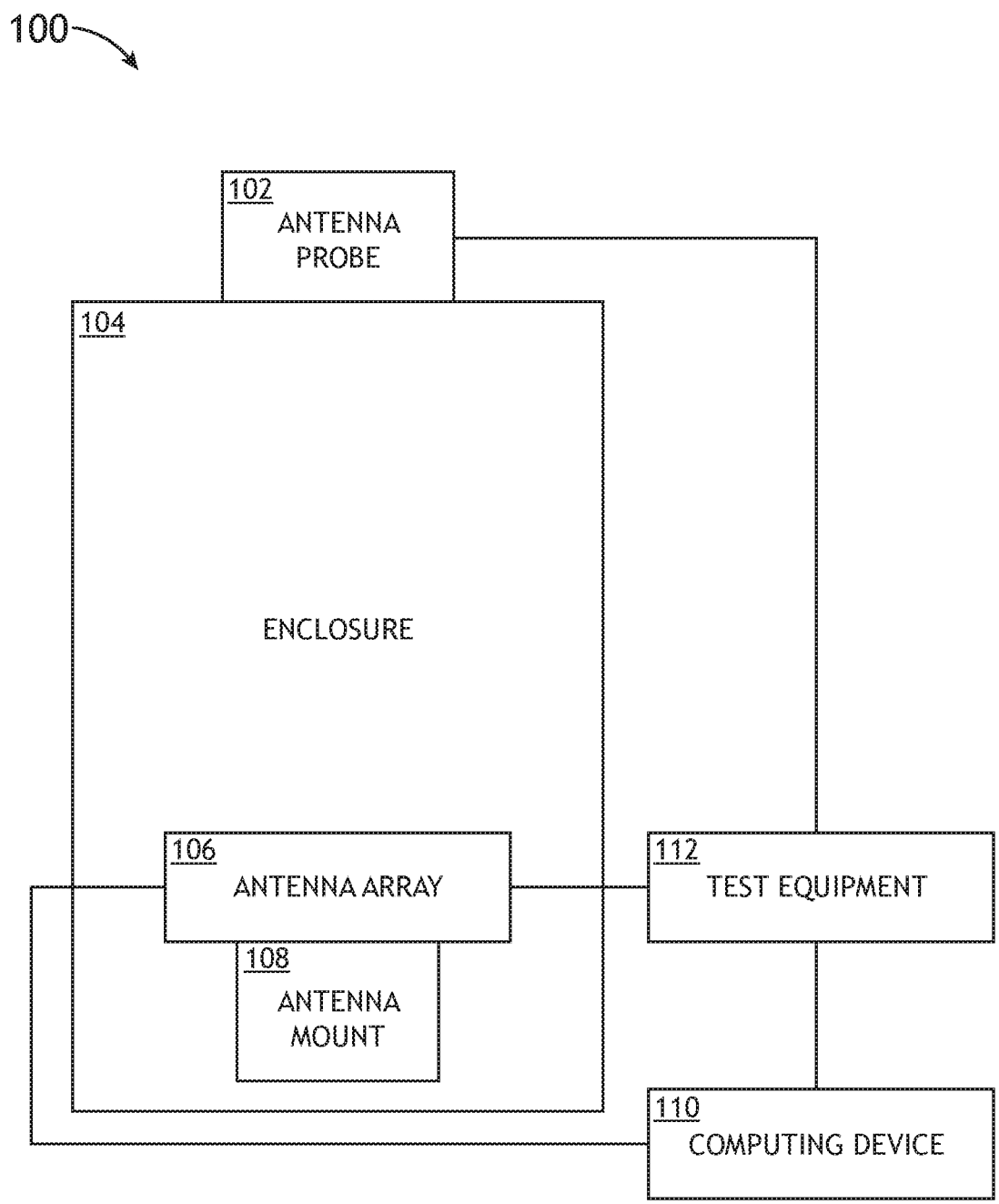
FIG. 1 is a view of an exemplary embodiment of a system according to the inventive concepts disclosed herein.
Figure 2:
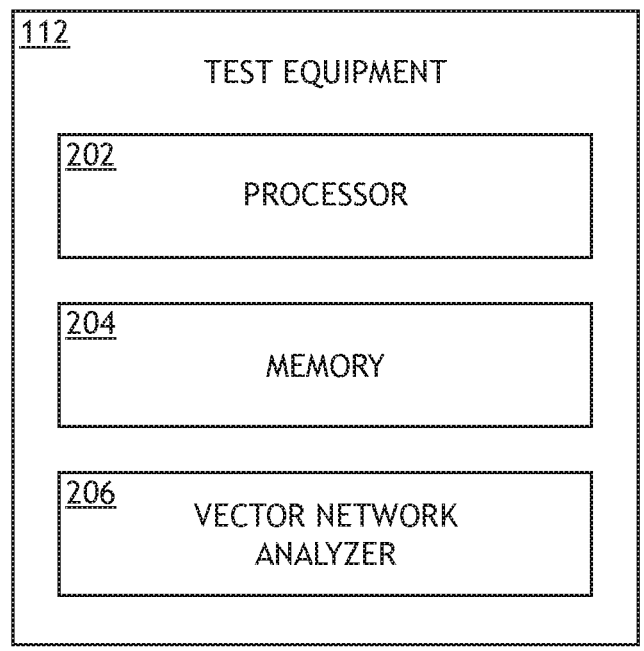
FIG. 2 is an exemplary test equipment of the system of FIG. 1 according to the inventive concepts disclosed herein.
Figure 3:
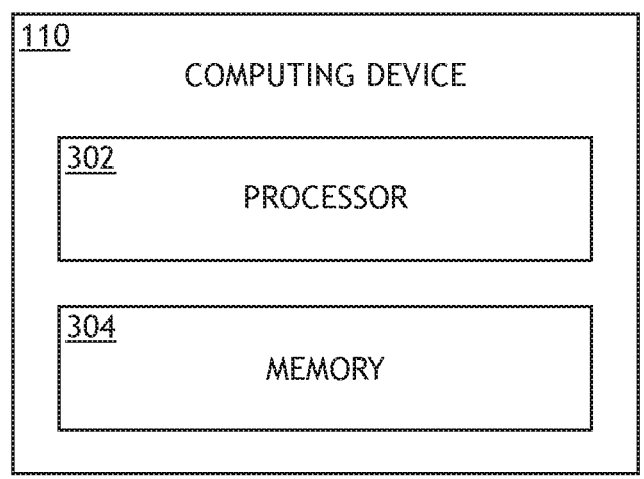
FIG. 3 is an exemplary computing device of the system of FIG. 1 according to the inventive concepts disclosed herein.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination or sub-combination of two or more such features, along with any other features which may not necessarily be expressly described or inherently present in the instant disclosure.

Broadly, embodiments of the inventive concepts disclosed herein are directed to a method and a system configured to test and/or calibrate an antenna array (e.g., an active phased array antenna, commonly referred to as an ESA). Some embodiments may include an automated calibration solution for calibrating and/or recalibrating ESA antennas. Some embodiments may use the techniques described herein in a manual fashion. Various environmental conditions, operating location, and desired changes to operating frequencies may drive a customer need for a convenient solution to quickly calibrate an ESA antenna. Some embodiments disclosed herein may be implemented as a software package executed by a processor causing the calibration solution to be performed.

Referring now to FIGS. 1, 2, 3, 4A, and 4B, exemplary embodiments of a system 100 according to the inventive concepts disclosed herein are depicted. The system 100 may be implemented as any suitable system. For example, as shown in FIG. 1, the system 100 may include at least one antenna probe 102, at least one enclosure 104, at least one antenna array 106, at least one antenna mount 108, at least one computing device 110, and/or at least one test equipment 112, some or all of which may be communicatively coupled at any given time.

Some embodiments may include at least one processor (e.g., at least one processor 202 and/or at least one processor 302) computing gain and phase offset values for each individual antenna radiating element 402 of an antenna array 106 (e.g., a phased array antenna). These gain and phase offset values may be used as a calibration factors (e.g., calibration coefficients) by system firmware (e.g., maintained in a non-transitory computer-readable medium, such as memory 204 and/or 304) to account for manufacturing tolerances and behavioral changes across frequency and temperature, enabling the system and/or antenna array 106 to achieve optimum performance. For example, an uncalibrated antenna array 106 may be placed in an enclosure 104 (e.g., an exceptionally small anechoic chamber enclosure) fixture on a stationary antenna mount 108. The antenna array 106 may be orthogonally aligned to a stationary antenna probe 102. Test equipment 112 may provide power to the antenna array 106, source vector measurement stimulus signals, and capture composite vector measurement responses. The computing device 110 may communicate with the antenna array 106 to set the individual radiating elements 402 to coding patterns (e.g., various sets of reference and encoding states) as defined in the equations herein (e.g., as shown in FIGS. 7A, 7B, 7C, and 7D). The computing device 110 executing software may capture measured results from the test equipment 112 and may synchronize the measured results with each known coding state. The computing device 110 executing software may perform a calculation to compensate for the physics of the antenna probe 102 using a ray tracing algorithm to locate the phase center of the probe 102 at the specific frequency of calibration, then may process the results according to the defined equations (e.g., as shown in FIGS. 7A, 7B, 7C, and 7D) to yield a complex calibration coefficient for each individual antenna radiating element. This list of results may be used by at least one processor (e.g., 202 and/or 302) executing firmware to compute relative gain and/or phase offsets to be applied to control registers for each individual antenna radiating element 402 (typically in the form of a calibration file or memory table).

Figure 4A:
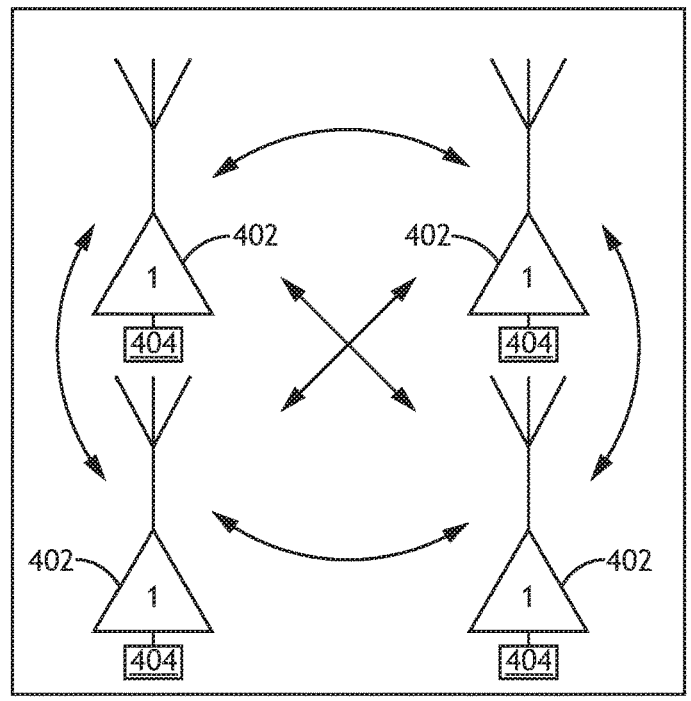
FIGS. 4A and 4B show an exemplary antenna array of the system of FIG. 1 according to the inventive concepts disclosed herein.
Figure 4B:
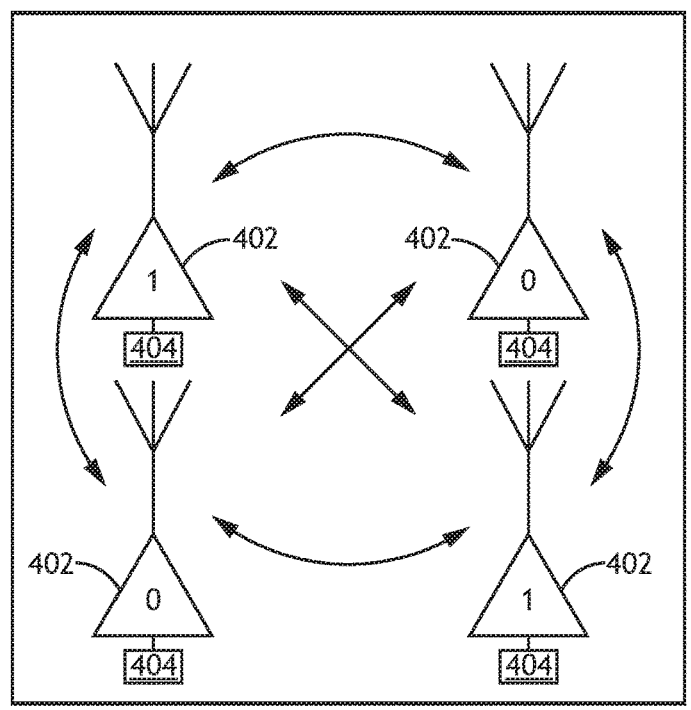

For example, the antenna array 106 may be a phased array antenna (e.g., an active phased array antenna, commonly referred to as an ESA). The antenna array 106 may include antenna radiating elements 402 and gain and phase registers 404, as shown in FIGS. 4A and 4B. Each of the antenna radiating elements 402 may be in a powered on state or a powered down state. For example, some or all of the antenna radiating elements 402 may be in a powered on state at a given time. For example, some or all of the antenna radiating elements 402 may be in a powered down state at a given time. While the antenna array 106 exemplarily is depicted with four antenna radiating elements 402 for illustrative purposes, the antenna array 106 may include any suitable number of antenna radiating elements 402, such as hundreds, thousands, or more. The antenna array 106 may be programmed (e.g., by the at least one processor 202 and/or the at least one processor 302) with the complex calibration coefficients, such as by programming control registers on the antenna array 106 and each control register associated with at least one given antenna radiating element 402.

Referring to FIGS. 4A and 4B, the issue with existing calibration techniques using ON/OFF element coding is that the existing calibration techniques rely on the assumption that mutual coupling between a single active antenna radiating element 402 and another individual coupled element 402 on the antenna array 106 is the same, whether or not the coupled element 402 is active (ON) as shown in FIG. 4A, or in a power down (OFF) state as shown in FIG. 4B. In reality the physical coupling may not be the same between these two states, which can lead to errors in the calibration results and diminish the benefit of existing approaches. The principle behind the existing approach using ON/OFF element coding is the assumption that there is a linear relationship between the coupling of each element 402 to the stationary calibration antenna probe 102 under encoding conditions. More importantly, the encoding of a single element 402 (e.g. switching an element from ON to OFF) may have a negligible effect on the coupling of neighboring elements 402. Again, for the existing calibration approaches, the assumption throughout the ON/OFF encoding process is that an element 402 in the OFF state is ideally terminated and, therefore, not causing changes in the mutual coupling to its neighboring elements 402. For certain planar aperture design configurations, with symmetrical element placement, and good isolation between elements (i.e. low mutual coupling) this ON/OFF encoding process can yield usable results that can still meet the target specifications, but may not hold in the general case for any active phased array antenna. In reality an element 402 in the OFF state may not be ideally terminated and may re-radiate energy from the element's neighboring elements 402. The neighboring elements 402 (which would normally re-radiate some energy from the element 402 that is OFF) may not do so. From the perspective of the test antenna probe 102, turning an antenna radiating element 402 from ON to OFF may result in a larger difference in signal than would be seen from an isolated element 402 changing from ON to OFF because the overall power level of test signal compared to the noise floor noise may be much greater. Some embodiments expand on the fundamental idea behind the differential ON/OFF element coding approach by using differential measurements with alternating phase coding to improve calibration results. Some embodiments use multiple sets of differential measurements with multiple phase code settings.

Figure 5:
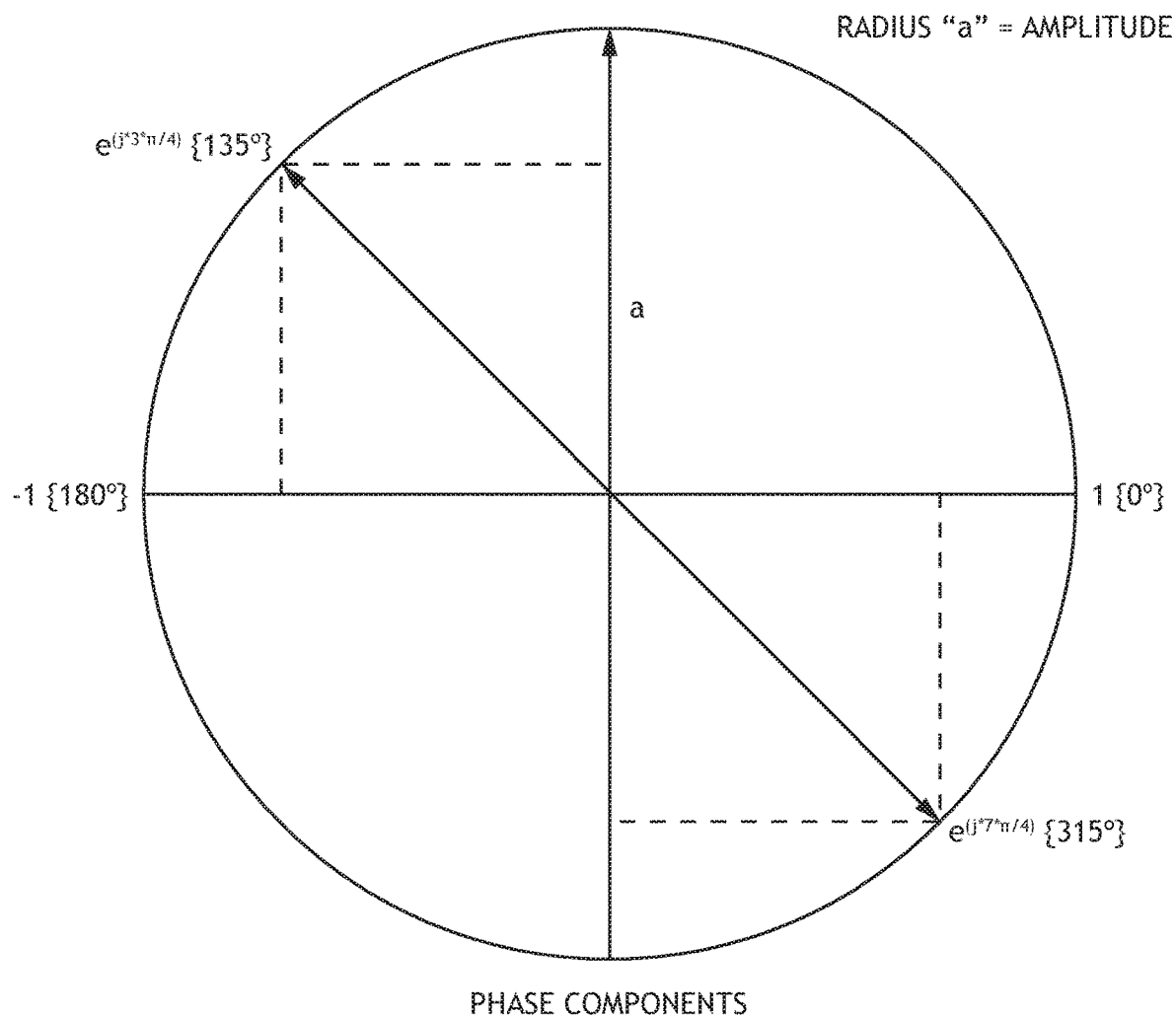
FIGS. 5 and 6 illustrate writing phase offset values into two quadrants of a phase circle so as to provide both positive and negative vector components according to the inventive concepts disclosed herein.
Figure 6:
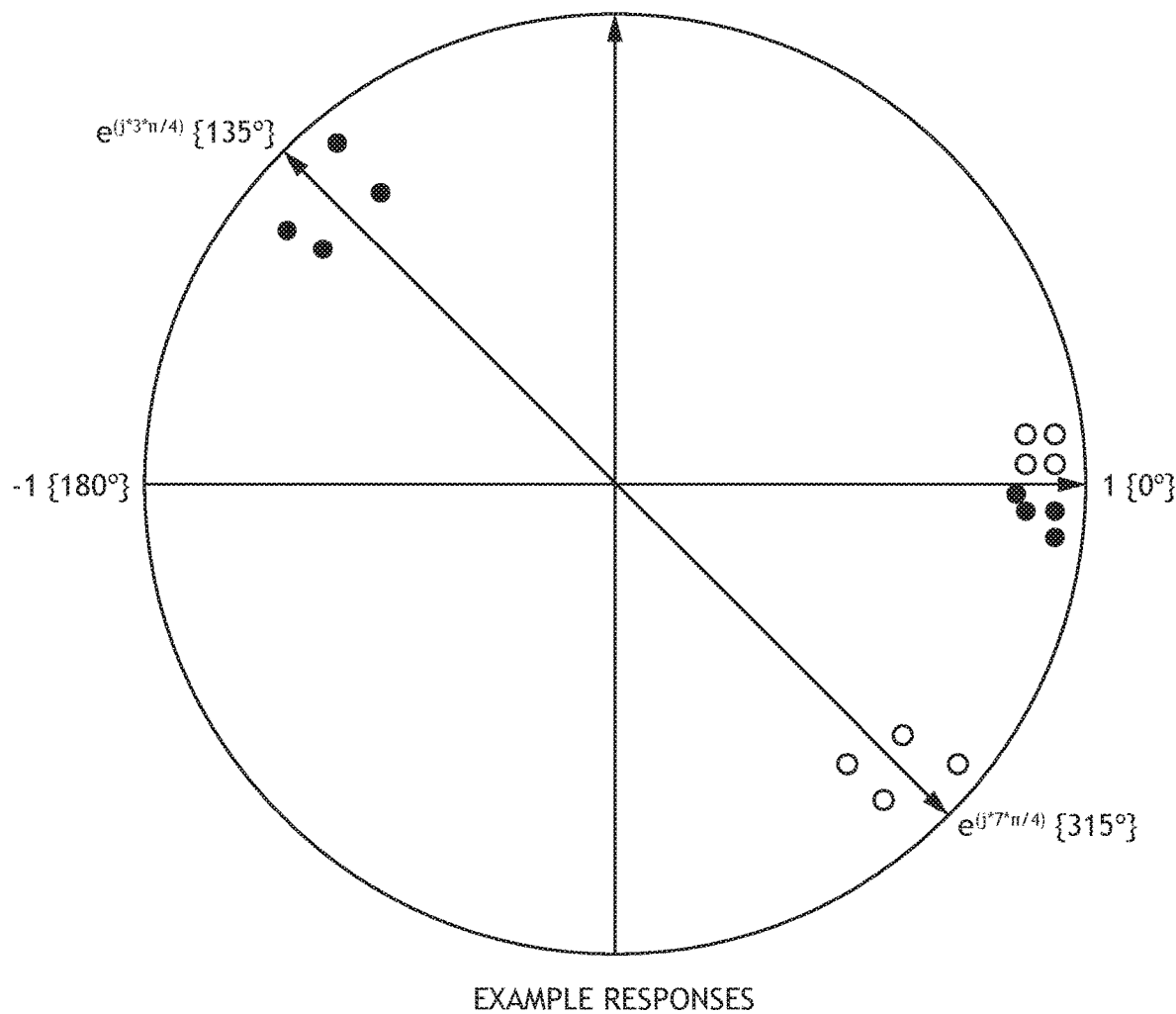

As illustrated in FIGS. 5 and 6, some embodiments may include writing (e.g., alternately writing) phase offset values into two quadrants of a phase circle so as to provide both positive and negative vector components (e.g., within the possible degrees of freedom) as illustrated in FIGS. 5 and 6. This approach can be expanded to include any or all potential angles that embedded phase shifters of the antenna array 106 can be set to. With the reference phase angle of 0 degrees oriented on the right-hand side, the exemplary phase angles that provide these exemplary components are 135 degrees and 315 degrees as shown in FIG. 5, though in some embodiments, any suitable phase angles may be used. The measurements at these angles may be compared to a reference measurement with all antenna radiating elements 402 coded at 0 degrees. This approach may also include another reference measurement with all antenna radiating elements 402 in the power down state (i.e. OFF) to subtract out coherent signal leakage (not ambient noise or additive white Gaussian noise) at the calibration frequency from the test equipment 112 source to the probe 102 (in transmit) and from the test equipment 112 source to the antenna array 106 (e.g., an ESA) (in receive). This coherent signal leakage may be obtained through the operation of a network analyzer that has a receiver synchronized in lock-step with a signal source. Some embodiments may include the use of multiple phase code settings versus only two settings of existing approaches. The multiple phase code settings may include one measurement for each code, along with two global reference measurements (e.g., all elements 402 OFF for quantifying coherent signal leakage at the calibrated frequency, and all elements 402 ON for a reference field measurement). In some embodiments, using such multiple phase settings may maximize the benefit of greater signal to noise ratio while also eliminating the assumption regarding mutual coupling because all antenna radiating elements 402 may be active for all measurements (except the leakage measurement where all antenna radiating elements 402 are in the OFF power down state). In some embodiments, with this approach, there may never be a situation where there is some mix of antenna radiating elements 402 that are ON and antenna radiating elements 402 that are OFF, meaning that mutual coupling is truly the same for all phase coding that is applied.

Referring again to FIGS. 1-3, the computing device 110 may include at least one processor 302 and at least one memory 304, which may be communicatively coupled. The at least one processor 302 may be implemented as any suitable type and number of processors. For example, the at least one processor 302 may include at least one general purpose processor (e.g., at least one central processing unit (CPU)), at least one digital signal processor (DSP), at least one application specific integrated circuit (ASIC), and/or at least one field-programmable gate array (FPGA). The at least one processor 302 may be configured to perform (e.g., collectively perform if more than one processor) any or all of the operations disclosed throughout. The processor 104 may be configured to run various software and/or firmware applications and/or computer code stored (e.g., maintained)

in a non-transitory computer-readable medium (e.g., memory 304) and configured to execute various instructions or operations.

The test equipment 112 may include at least one processor 202, at least one memory 204, and/or at least one vector network analyzer 206, some or all of which may be communicatively coupled. The at least one processor 202 may be implemented as any suitable type and number of processors. For example, the at least one processor 202 may include at least one general purpose processor (e.g., at least one central processing unit (CPU)), at least one digital signal processor (DSP), at least one application specific integrated circuit (ASIC), and/or at least one field-programmable gate array (FPGA). The at least one processor 202 may be configured to perform (e.g., collectively perform if more than one processor) any or all of the operations disclosed throughout. The processor 202 may be configured to run various software and/or firmware applications and/or computer code stored (e.g., maintained) in a non-transitory computer-readable medium (e.g., memory 204) and configured to execute various instructions or operations. The vector network analyzer 206 may be an industry standard instrument. By using an internal reference signal compared to a sourced signal in synch with the vector network analyzer's 206 receiver, the vector network analyzer 206 may be used to capture composite radiofrequency (RF) signal's complex amplitude and phase as processed by an antenna array 106 and probe 102 in each of the Hadamard encoded states (e.g., the vector network analyzer 206 may directly measure "m1" through "m16" in the four-element array example (e.g., illustrated in the equations of FIGS. 7B-7D) used to describe various concepts of this disclosure).

In some embodiments, at least one processor (e.g., the at least one processor 202 and/or the at least one processor 302) may be configured to perform (e.g., collectively perform if more than one processor) any or all of the operations disclosed throughout.

For example, at least one processor (e.g., the at least one processor 202 and/or the at least one processor 302) may be configured to: use a generalized form of Hadamard Codes (e.g., as shown in Equation 5 of FIG. 7A) to perform measurements of the antenna radiating elements 402, the generalized form of Hadamard Codes including amplitude coefficients and phase coefficients written to gain and phase registers 404 (see FIGS. 4A-B) for the antenna radiating elements 402. In some embodiments, the generalized form of Hadamard Codes has elements equal to $ae^{jn\pi/4}$, wherein a is an amplitude coefficient for each antenna radiating element 402 at each coding state, wherein e is Euler's number, wherein j (i.e. $(-1)^{1/2}$) is an imaginary operator, wherein n is a real number value of coding state between zero (0) and eight (8) determining reference angle and encoded angle.

For example, at least one processor (e.g., the at least one processor 202 and/or the at least one processor 302) may be configured to: receive a first set of measurements of the antenna radiating elements 402 as a first measurement coding matrix (e.g., $M_1$ as shown in Equation 6 of FIG. 7B). In some embodiments, the antenna array 106 comprises x antenna radiating elements 402, wherein x is an integer greater than or equal to 2, wherein the first measurement coding matrix is equal to a first matrix multiplied by the complex calibration coefficients, wherein the first matrix includes elements of $ae^{jn\pi/4}$, wherein for elements in the first matrix corresponding to a position of an x-th order Hadamard matrix having a value of 1: a equals 1 and n equals 3, wherein for elements in the first matrix corresponding to a position of the x-th order Hadamard matrix having a value of −1: a equals 1 and n equals 0.

For example, at least one processor (e.g., the at least one processor 202 and/or the at least one processor 302) may be configured to: receive a second set of measurements of the antenna radiating elements 402 as a second measurement coding matrix (e.g., $M_2$ as shown in Equation 7 of FIG. 7B). In some embodiments, the antenna array 106 comprises x antenna radiating elements 402, wherein x is an integer greater than or equal to 2, wherein the second measurement coding matrix is equal to a second matrix multiplied by the complex calibration coefficients, wherein the second matrix includes elements of $ae^{jn\pi/4}$, wherein for elements in the second matrix corresponding to a position of an x-th order Hadamard matrix having a value of 1: a equals 1 and n equals 7, wherein for elements in the second matrix corresponding to a position of the x-th order Hadamard matrix having a value of −1: a equals 1 and n equals 0. In some embodiments, at least some of the antenna radiating elements 402 are coded with a first phase for the first set of measurements of the antenna radiating elements 402, and the at least some of the antenna radiating elements 402 are coded with a second phase for the second set of measurements of the antenna radiating elements 402, wherein the first phase and the second phase are in different quadrants of a phase circle (e.g., as shown in FIGS. 5 and 6).

For example, at least one processor (e.g., the at least one processor 202 and/or the at least one processor 302) may be configured to: receive a third set of measurements of the antenna radiating elements 402 as a third measurement coding matrix (e.g., $M_3$ as shown in Equation 8 of FIG. 7B), wherein the third measurement coding matrix corresponds to all of the antenna radiating elements 402 being in a powered on state. In some embodiments, the antenna array 106 comprises x antenna radiating elements 402, wherein x is an integer greater than or equal to 2, wherein the third measurement coding matrix is equal to a third matrix multiplied by the complex calibration coefficients, wherein the third matrix includes elements of $ae^{jn\pi/4}$, wherein for elements in the third matrix corresponding to a position of an x-th order Hadamard matrix having a value of 1: a equals 1 and n equals 0, wherein for elements in the third matrix corresponding to a position of the x-th order Hadamard matrix having a value of −1: a equals 1 and n equals 0.

For example, at least one processor (e.g., the at least one processor 202 and/or the at least one processor 302) may be configured to: receive a fourth set of measurements of the antenna radiating elements 402 as a fourth measurement coding matrix (e.g., $M_4$ as shown in Equation 9 of FIG. 7C), wherein the fourth measurement coding matrix corresponds to all of the antenna radiating elements being in a powered down state. In some embodiments, the antenna array 106 comprises x antenna radiating elements 402, wherein x is an integer greater than or equal to 2, wherein the fourth measurement coding matrix is equal to a fourth matrix multiplied by the complex calibration coefficients, wherein the fourth matrix includes elements of $ae^{jn\pi/4}$, wherein for elements in the fourth matrix corresponding to a position of an x-th order Hadamard matrix having a value of 1: a equals 0 and n equals 0, wherein for elements in the fourth matrix corresponding to a position of the x-th order Hadamard matrix having a value of −1: a equals 0 and n equals 0.

For example, at least one processor (e.g., the at least one processor 202 and/or the at least one processor 302) may be configured to: calculate a reference encoding matrix (e.g., E as shown in Equation 10 of FIG. 7C) with coherent signal leakage de-embedded by subtracting the fourth measurement coding matrix from the third measurement coding matrix.

For example, at least one processor (e.g., the at least one processor 202 and/or the at least one processor 302) may be configured to: calculate a differential encoding matrix (e.g., F as shown in Equation 11 of FIG. 7C) providing twice a signal-to-noise ratio by adding the first measurement coding matrix and the second measurement coding matrix.

For example, at least one processor (e.g., the at least one processor 202 and/or the at least one processor 302) may be configured to: calculate a differential matrix (e.g., G as shown in Equation 12 of FIG. 7C) decoded back to conventional Hadamard matrix by subtracting the differential encoding matrix providing twice a signal-to-noise ratio from the reference encoding matrix with coherent signal leakage de-embedded.

For example, at least one processor (e.g., the at least one processor 202 and/or the at least one processor 302) may be configured to: calculate complex calibration coefficients (e.g., $\{y_i\}$ as shown in Equation 13 of FIG. 7D) for the antenna radiating elements 402 by multiplying an inverse Hadamard matrix by the differential matrix decoded back to conventional Hadamard matrix. In some embodiments, the complex calibration coefficients include gain offset values and phase offset values.

For example, at least one processor (e.g., the at least one processor 202 and/or the at least one processor 302) may be configured to: program the antenna array 106 (e.g., program the gain and phase registers 404 (see FIGS. 4A-4B) of the antenna array 106) with amplitude and phase offsets computed from the complex calibration coefficients. In some embodiments, once the antenna array 106 is programmed with the amplitude and phase offsets computed from the complex calibration coefficients, the antenna array 106 is configured to form an antenna beam more accurately (e.g., with improved definition between lobes for an antenna beam cross-section) than prior to the antenna array 106 being programmed with the amplitude and phase offsets computed from the complex calibration coefficients.

Referring now to FIGS. 7A, 7B, 7C, and 7D, equations, which may be used in an exemplary embodiment of testing and/or calibrating an exemplary antenna array 106 having four antenna radiating elements 402, are shown according to the inventive concepts disclosed herein. The exemplary matrices, shown in FIGS. 7A, 7B, 7C, and 7D, are for an antenna array 106 with four antenna radiating elements 402 in an array of 2-elements by 2-elements and are used as an example to illustrate the concept; some embodiments, may include using adapted versions of such equations (as would be apparent to one of ordinary skill in the art) to calibrate an antenna array 106 having any number of antenna radiating elements 402. Antenna radiating elements 402 are represented as columns, the coding states are represented as rows, and the operating state for any given element is the value in the particular row/column position (e.g. the operational state for element #1, coding state #1 is denoted by the value in row #1/column #1). At least one processor (e.g., the at least one processor 202 and/or the at least one processor 302) may be configured to apply the equations of FIGS. 7A, 7B, 7C, and 7D and perform calculations described in and/or related to the equations of FIGS. 7A, 7B, 7C, and 7D.

Referring now to Equation 1 of FIG. 7A, for an exemplary antenna array 106 (e.g., an ESA) having four antenna radiating elements 402, the Hadamard matrix may be used as a basis for calibrating the antenna array 106. In general, a Hadamard matrix can be generated by using Equation 1. $H_2^k$ equals the generalized form of Hadamard matrix. $H_2^{k-1}$ equals the matrix of reference and encoding states.

Referring now to Equation 2 of FIG. 7A, $H_2$ is shown. $H_2$ may equal orthogonally arranged reference and encoding states.

Referring now to Equation 3 of FIG. 7A, one of the important properties of the Hadamard matrix is that, for H being a Hadamard matrix of order n, the transpose of H is closely related to its inverse, as shown in Equation 3. n equals the order of the Hadamard matrix. H equals the Hadamard matrix of the $n^{th}$ order. $H^T$ equals the transpose of the Hadamard matrix of the $n^{th}$ order. $I_n$ equals the identity matrix of size n by n. The target may be to calibrate the antenna array 106 with this orthogonal set of code.

Referring now to Equation 4 of FIG. 7A, $H_4$ equals conventional Hadamard Codes for four orthogonal state arrangements. In $H_4$, 1 refers to an element reference state. In $H_4$, −1 refers to an element encoded state.

Referring now to Equation 5 of FIG. 7A, $H_4$ of Equation 5 may be used to calibrate the antenna array 106 with phase variation. $H_4$ may be the generalized form of Hadamard Codes of amplitude and phase arrangements for a 2-element by 2-element antenna array (4 elements total). a equals an amplitude coefficient for each antenna radiating element 402 at each coding state. e equals Euler's number. j equals an imaginary operator ($\sqrt{-1}$). π equals the number pi. n equals a value (e.g., a real valued number between zero (0) and eight (8)) of coding state determining reference angle and encoded angle.

Referring now to Equation 6 of FIG. 7B, $M_1$ is a first measurement coding matrix corresponding to a first set of measurements with all amplitude coefficients ('a') equal to 1, representing an absolute power level at an optimum gain setting (typically in the linear gain region before compression). For elements in the first measurement coding matrix corresponding to a position of an x-th (where x is greater than or equal to 2) order Hadamard matrix having a value of 1: a equals 1 and n equals 3. For elements in the first measurement coding matrix corresponding to a position of the x-th order Hadamard matrix having a value of −1: a equals 1 and n equals 0. That is, $ae^{j\pi(3/4)}$ equals an encoded state with value 'n' of three for a phase angle of 135 degrees. That is, 1 equals a reference state with value 'n' of zero for a phase angle of zero degrees. $y_i$ equals an unknown complex calibration coefficient for antenna radiating element #1 (to be solved for). $y_2$ equals an unknown complex calibration coefficient for antenna radiating element #2 (to be solved for). $y_3$ equals an unknown complex calibration coefficient for antenna radiating element #3 (to be solved for). $y_4$ equals an unknown complex calibration coefficient for element #4 (to be solved for). $m_1$ equals a measured value obtained when antenna radiating elements are in "$M_1$" coding state #1 (row #1). $m_2$ equals a measured value obtained when antenna radiating elements are in "$M_1$" coding state #2 (row #2). $m_3$ equals a measured value obtained when antenna radiating elements are in "$M_1$" coding state #3 (row #3). $m_4$ equals a measured value obtained when antenna radiating elements are in "$M_1$" coding state #4 (row #4). Here, $\{y_i\}$ are the complex gain and phase offsets for each individual antenna radiating element 402, and $\{m_j\}$ are each measurement taken from a vector network analyzer.

Referring now to Equation 7 of FIG. 7B, $M_2$ is a second measurement coding matrix corresponding to a second set of measurements with all amplitude coefficients ('a') equal to 1. For elements in the second measurement coding matrix corresponding to a position of an x-th (where x is greater than or equal to 2) order Hadamard matrix having a value of 1: a equals 1 and n equals 7. For elements in the second measurement coding matrix corresponding to a position of the x-th order Hadamard matrix having a value of −1: a equals 1 and n equals 0. That is, $ae^{j\pi(7/4)}$ equals an encoded state with value 'n' of seven for a phase angle of 315 degrees. That is, 1 equals a reference state with value 'n' of zero for a phase angle of zero degrees. $m_5$ equals a measured value obtained when antenna radiating elements are in "$M_2$" coding state #1 (row #1). $m_6$ equals a measured value obtained when antenna radiating elements are in "$M_2$" coding state #2 (row #2). $m_7$ equals a measured value obtained when antenna radiating elements are in "$M_2$" coding state #3 (row #3). ma equals a measured value obtained when antenna radiating elements are in "$M_2$" coding state #4 (row #4).

Referring now to Equation 8 of FIG. 7B, $M_3$ is a third measurement coding matrix corresponding to a third set of measurements with all amplitude coefficients ('a') equal to 1. For elements in the third measurement coding matrix corresponding to a position of an x-th (where x is greater than or equal to 2) order Hadamard matrix having a value of 1: a equals 1 and n equals 0. For elements in the third measurement coding matrix corresponding to a position of the x-th order Hadamard matrix having a value of −1: a equals 1 and n equals 0. That is, 1 equals a reference state with value 'n' of zero for a phase angle of zero degrees. $m_9$ equals a measured value obtained when antenna radiating elements are in "$M_3$" coding state #1 (row #1). $m_{10}$ equals $m_9$. mug equals $m_9$. $m_{12}$ equals $m_9$.

Referring now to Equation 9 of FIG. 7C, $M_4$ is a fourth measurement coding matrix corresponding to a fourth set of measurements with all amplitude coefficients ('a') equal to 0 (i.e., in a powered down state). For elements in the fourth measurement coding matrix corresponding to a position of an x-th (where x is greater than or equal to 2) order Hadamard matrix having a value of 1: a equals 0 and n equals 0. For elements in the third measurement coding matrix corresponding to a position of the x-th order Hadamard matrix having a value of −1: a equals 0 and n equals 0. That is, 0 equals a reference state with an antenna radiating element in a powered down state. $m_{13}$ equals a measured value obtained when antenna radiating elements are in "$M_4$" coding state #1 (row #1). $m_{14}$ equals $m_{13}$. $m_{15}$ equals $m_{13}$. $m_{16}$ equals $m_{13}$.

Each row of $M_3$ is a single measurement with one reference encoding, and each row of $M_4$ is a single measurement with one reference encoding. These two reference measurements may only need to be taken once during the start of the calibration process. The rows are fully populated in these matrices with the same values as mathematical placeholders.

Referring now to Equation 10 of FIG. 7C, E equals a reference encoding matrix with coherent signal leakage de-embedded ($M_3$-$M_4$). Performing the operation of $M_3$-$M_4$ cancels out coherent signal leakage from antenna array 106 to the antenna probe 102 through all antenna radiating elements 402. Some embodiments may omit this operation where phase coherent signal leakage is negligible.

Referring now to Equation 11 of FIG. 7C, F equals a differential encoding matrix providing twice a signal-to-noise ratio. Adding the first measurement coding matrix and the second measurement coding matrix yields twice the signal amplitude to noise ratio, improving accuracy of results.

Referring now to Equation 12 of FIG. 7C, G equals a differential matrix decoded back to conventional Hadamard matrix by subtracting the differential encoding matrix providing twice a signal-to-noise ratio from the reference encoding matrix, or from the reference encoding matrix with coherent signal leakage de-embedded.

Referring now to Equation 13 of FIG. 7D, the orthogonal properties of a Hadamard matrix allow us to decode Hadamard matrix's operation on the unknown coefficients with the inverse Hadamard matrix and calculate the calibration coefficients $\{y_i\}$ for each of the antenna radiating elements 402. Calculating the complex calibration coefficients for the antenna radiating elements 402 may include multiplying an inverse Hadamard matrix by the differential matrix decoded back to conventional Hadamard matrix.

Figure 8:
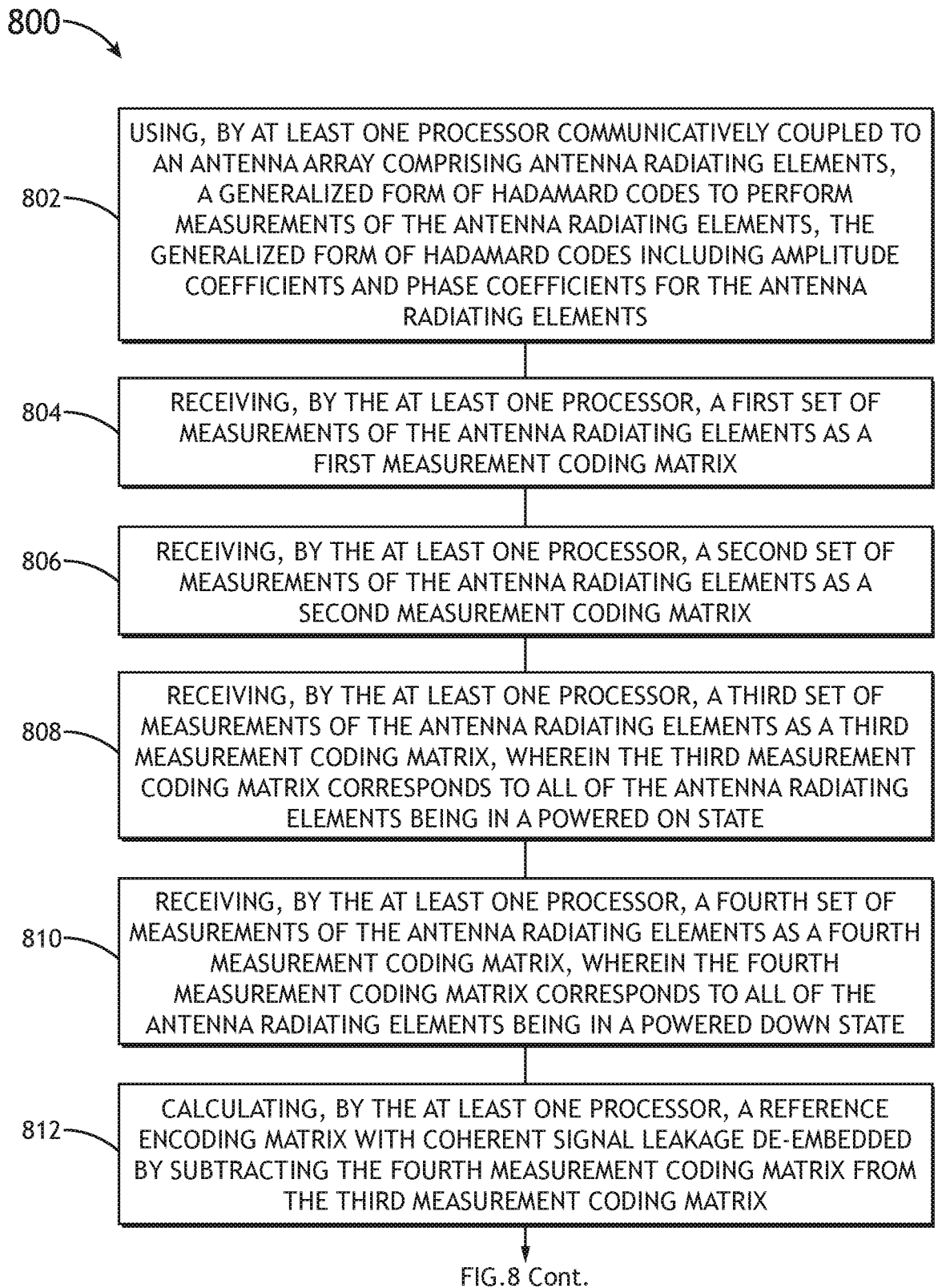
FIG. 8 is a diagram of an exemplary embodiment of a method according to the inventive concepts disclosed herein.
Figure 8:
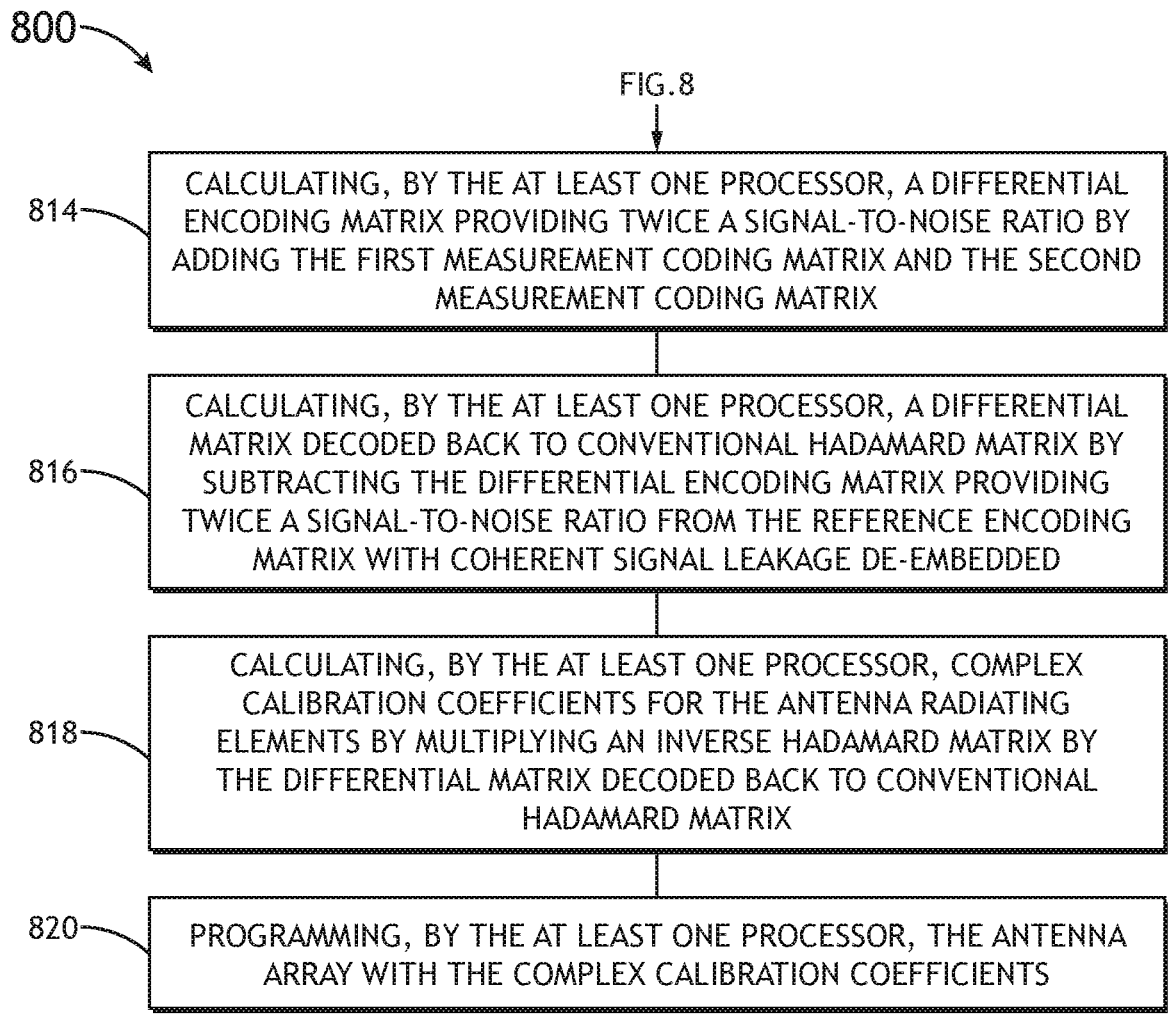

Referring now to FIG. 8, an exemplary embodiment of a method 800 according to the inventive concepts disclosed herein may include one or more of the following steps. Additionally, for example, some embodiments may include performing one more instances of the method 800 iteratively, concurrently, and/or sequentially. Additionally, for example, at least some of the steps of the method 800 may be performed in parallel and/or concurrently. Additionally, in some embodiments, at least some of the steps of the method 800 may be performed non-sequentially.

A step 802 may include using, by at least one processor communicatively coupled to an antenna array comprising antenna radiating elements, a generalized form of Hadamard Codes to perform measurements of the antenna radiating elements, the generalized form of Hadamard Codes including amplitude coefficients and phase coefficients for the antenna radiating elements.

A step 804 may include receiving, by the at least one processor, a first set of measurements of the antenna radiating elements as a first measurement coding matrix.

A step 806 may include receiving, by the at least one processor, a second set of measurements of the antenna radiating elements as a second measurement coding matrix.

A step 808 may include receiving, by the at least one processor, a third set of measurements of the antenna radiating elements as a third measurement coding matrix, wherein the third measurement coding matrix corresponds to all of the antenna radiating elements being in a powered on state.

A step 810 may include receiving, by the at least one processor, a fourth set of measurements of the antenna radiating elements as a fourth measurement coding matrix, wherein the fourth measurement coding matrix corresponds to all of the antenna radiating elements being in a powered down state.

A step 812 may include calculating, by the at least one processor, a reference encoding matrix with coherent signal leakage de-embedded by subtracting the fourth measurement coding matrix from the third measurement coding matrix.

A step 814 may include calculating, by the at least one processor, a differential encoding matrix providing twice a signal-to-noise ratio by adding the first measurement coding matrix and the second measurement coding matrix.

A step 816 may include calculating, by the at least one processor, a differential matrix decoded back to conventional Hadamard matrix by subtracting the differential encoding matrix providing twice a signal-to-noise ratio from the reference encoding matrix with coherent signal leakage de-embedded.

A step 818 may include calculating, by the at least one processor, complex calibration coefficients for the antenna radiating elements by multiplying an inverse Hadamard matrix by the differential matrix decoded back to conventional Hadamard matrix.

A step 820 may include programming, by the at least one processor, the antenna array with amplitude and phase offsets computed from the complex calibration coefficients.

Further, the method 800 may include any of the operations disclosed throughout.

As will be appreciated from the above, embodiments of the inventive concepts disclosed herein may be directed to a method and a system configured to test and/or calibrate an antenna array.

As used throughout and as would be appreciated by those skilled in the art, "at least one non-transitory computer-readable medium" may refer to as at least one non-transitory computer-readable medium (e.g., at least one computer-readable medium implemented as hardware; e.g., at least one non-transitory processor-readable medium, at least one memory (e.g., at least one nonvolatile memory, at least one volatile memory, or a combination thereof; e.g., at least one random-access memory, at least one flash memory, at least one read-only memory (ROM) (e.g., at least one electrically erasable programmable read-only memory (EEPROM)), at least one on-processor memory (e.g., at least one on-processor cache, at least one on-processor buffer, at least one on-processor flash memory, at least one on-processor EEPROM, or a combination thereof), at least one storage device (e.g., at least one hard-disk drive, at least one tape drive, at least one solid-state drive, at least one flash drive, at least one readable and/or writable disk of at least one optical drive configured to read from and/or write to the at least one readable and/or writable disk, or a combination thereof).

As used throughout, "at least one" means one or a plurality of; for example, "at least one" may comprise one, two, three, . . . , one hundred, or more. Similarly, as used throughout, "one or more" means one or a plurality of; for example, "one or more" may comprise one, two, three, . . . , one hundred, or more. Further, as used throughout, "zero or more" means zero, one, or a plurality of; for example, "zero or more" may comprise zero, one, two, three, . . . , one hundred, or more.

In the present disclosure, the methods, operations, and/or functionality disclosed may be implemented as sets of instructions or software readable by a device. Further, it is understood that the specific order or hierarchy of steps in the methods, operations, and/or functionality disclosed are examples of exemplary approaches. Based upon design preferences, it is understood that the specific order or hierarchy of steps in the methods, operations, and/or functionality can be rearranged while remaining within the scope of the inventive concepts disclosed herein. The accompanying claims may present elements of the various steps in a sample order, and are not necessarily meant to be limited to the specific order or hierarchy presented.

It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

What is claimed is:

1. A system, comprising:
   an antenna array comprising antenna radiating elements; and
   at least one processor communicatively coupled to the antenna array, the at least one processor configured to:
   use a generalized form of Hadamard Codes to perform measurements of the antenna radiating elements, the generalized form of Hadamard Codes including amplitude coefficients and phase coefficients for the antenna radiating elements;
   receive a first set of measurements of the antenna radiating elements as a first measurement coding matrix;
   receive a second set of measurements of the antenna radiating elements as a second measurement coding matrix;
   receive a third set of measurements of the antenna radiating elements as a third measurement coding matrix, wherein the third measurement coding matrix corresponds to all of the antenna radiating elements being in a powered on state;
   receive a fourth set of measurements of the antenna radiating elements as a fourth measurement coding matrix, wherein the fourth measurement coding matrix corresponds to all of the antenna radiating elements being in a powered down state;
   calculate a reference encoding matrix with coherent signal leakage de-embedded by subtracting the fourth measurement coding matrix from the third measurement coding matrix;
   calculate a differential encoding matrix providing twice a signal-to-noise ratio by adding the first measurement coding matrix and the second measurement coding matrix;
   calculate a differential matrix decoded back to conventional Hadamard matrix by subtracting the differential encoding matrix providing twice a signal-to-noise ratio from the reference encoding matrix with coherent signal leakage de-embedded;
   calculate complex calibration coefficients for the antenna radiating elements by multiplying an inverse Hadamard matrix by the differential matrix decoded back to conventional Hadamard matrix; and
   program the antenna array with amplitude and phase offsets computed from the complex calibration coefficients.

2. The system of claim 1, wherein the generalized form of Hadamard Codes has elements equal to $ae^{jn\pi/4}$, wherein a is an amplitude coefficient for each antenna radiating element at each coding state, wherein e is Euler's number, wherein j is an imaginary operator, wherein n is an value of coding state determining reference angle and encoded angle.

3. The system of claim 2, wherein the antenna array comprises x antenna radiating elements, wherein x is an integer greater than or equal to 2, wherein the first measurement coding matrix is equal to a first matrix multiplied by the complex calibration coefficients, wherein the first matrix includes elements of $ae^{jn\pi/4}$, wherein for elements in the first matrix corresponding to a position of an x-th order Hadamard matrix having a value of 1: a equals 1 and n equals 3, wherein for elements in the first matrix corresponding to a position of the x-th order Hadamard matrix having a value of −1: a equals 1 and n equals 0.

4. The system of claim 2, wherein the antenna array comprises x antenna radiating elements, wherein x is an integer greater than or equal to 2, wherein the second measurement coding matrix is equal to a second matrix multiplied by the complex calibration coefficients, wherein the second matrix includes elements of $ae^{jn\pi/4}$, wherein for elements in the second matrix corresponding to a position of an x-th order Hadamard matrix having a value of 1: a equals 1 and n equals 7, wherein for elements in the second matrix corresponding to a position of the x-th order Hadamard matrix having a value of −1: a equals 1 and n equals 0.

5. The system of claim 2, wherein the antenna array comprises x antenna radiating elements, wherein x is an integer greater than or equal to 2, wherein the third measurement coding matrix is equal to a third matrix multiplied by the complex calibration coefficients, wherein the third matrix includes elements of $ae^{jn\pi/4}$, wherein for elements in the third matrix corresponding to a position of an x-th order Hadamard matrix having a value of 1: a equals 1 and n equals 0, wherein for elements in the third matrix corresponding to a position of the x-th order Hadamard matrix having a value of −1: a equals 1 and n equals 0.

6. The system of claim 2, wherein the antenna array comprises x antenna radiating elements, wherein x is an integer greater than or equal to 2, wherein the fourth measurement coding matrix is equal to a fourth matrix multiplied by the complex calibration coefficients, wherein the fourth matrix includes elements of $ae^{jn\pi/4}$, wherein for elements in the fourth matrix corresponding to a position of an x-th order Hadamard matrix having a value of 1: a equals 0 and n equals 0, wherein for elements in the fourth matrix corresponding to a position of the x-th order Hadamard matrix having a value of −1: a equals 0 and n equals 0.

7. The system of claim 2, wherein the antenna array comprises x antenna radiating elements, wherein x is an integer greater than or equal to 2, wherein the first measurement coding matrix is equal to a first matrix multiplied by the complex calibration coefficients, wherein the first matrix includes elements of $ae^{jn\pi/4}$, wherein for elements in the first matrix corresponding to a position of an x-th order Hadamard matrix having a value of 1: a equals 1 and n equals 3, wherein for elements in the first matrix corresponding to a position of the x-th order Hadamard matrix having a value of −1: a equals 1 and n equals 0; wherein the second measurement coding matrix is equal to a second matrix multiplied by the complex calibration coefficients, wherein the second matrix includes elements of $ae^{jn\pi/4}$, wherein for elements in the second matrix corresponding to a position of the x-th order Hadamard matrix having a value of 1: a equals 1 and n equals 7, wherein for elements in the second matrix corresponding to a position of the x-th order Hadamard matrix having a value of −1: a equals 1 and n equals 0; wherein the third measurement coding matrix is equal to a third matrix multiplied by the complex calibration coefficients, wherein the third matrix includes elements of $ae^{jn\pi/4}$, wherein for elements in the third matrix corresponding to a position of the x-th order Hadamard matrix having a value of 1: a equals 1 and n equals 0, wherein for elements in the third matrix corresponding to a position of the x-th order Hadamard matrix having a value of −1: a equals 1 and n equals 0; wherein the fourth measurement coding matrix is equal to a fourth matrix multiplied by the complex calibration coefficients, wherein the fourth matrix includes elements of $ae^{jn\pi/4}$, wherein for elements in the fourth matrix corresponding to a position of the x-th order Hadamard matrix having a value of 1: a equals 0 and n equals 0, wherein for elements in the fourth matrix corresponding to a position of the x-th order Hadamard matrix having a value of −1: a equals 0 and n equals 0.

8. The system of claim 1, wherein the antenna array is an electronically steered antenna (ESA).

9. The system of claim 1, wherein once the antenna array is programmed with the complex calibration coefficients, the antenna array is configured to form an antenna beam more accurately than prior to the antenna array being programmed with the complex calibration coefficients.

10. The system of claim 1, wherein the complex calibration coefficients include gain offset values and phase offset values.

11. The system of claim 1, further comprising an enclosure, wherein the antenna array is mounted in the enclosure.

12. The system of claim 11, wherein the enclosure is an anechoic chamber enclosure.

13. The system of claim 11, further comprising an antenna probe, wherein the antenna probe is orthogonally aligned to the antenna array.

14. The system of claim 1, wherein at least some of the antenna radiating elements are coded with a first phase for the first set of measurements of the antenna radiating elements, wherein the at least some of the antenna radiating elements are coded with a second phase for the second set of measurements of the antenna radiating elements, wherein the first phase and the second phase are in different quadrants of a phase circle.

15. A method, comprising:
using, by at least one processor communicatively coupled to an antenna array comprising antenna radiating elements, a generalized form of Hadamard Codes to perform measurements of the antenna radiating elements, the generalized form of Hadamard Codes including amplitude coefficients and phase coefficients for the antenna radiating elements;
receiving, by the at least one processor, a first set of measurements of the antenna radiating elements as a first measurement coding matrix;
receiving, by the at least one processor, a second set of measurements of the antenna radiating elements as a second measurement coding matrix;
receiving, by the at least one processor, a third set of measurements of the antenna radiating elements as a third measurement coding matrix, wherein the third measurement coding matrix corresponds to all of the antenna radiating elements being in a powered on state;
receiving, by the at least one processor, a fourth set of measurements of the antenna radiating elements as a fourth measurement coding matrix, wherein the fourth measurement coding matrix corresponds to all of the antenna radiating elements being in a powered down state;
calculating, by the at least one processor, a reference encoding matrix with coherent signal leakage de-embedded by subtracting the fourth measurement coding matrix from the third measurement coding matrix;
calculating, by the at least one processor, a differential encoding matrix providing twice a signal-to-noise ratio by adding the first measurement coding matrix and the second measurement coding matrix;
calculating, by the at least one processor, a differential matrix decoded back to conventional Hadamard matrix by subtracting the differential encoding matrix providing twice a signal-to-noise ratio from the reference encoding matrix with coherent signal leakage de-embedded;

calculating, by the at least one processor, complex calibration coefficients for the antenna radiating elements by multiplying an inverse Hadamard matrix by the differential matrix decoded back to conventional Hadamard matrix; and programming, by the at least one processor, the antenna array with amplitude and phase offsets computed from the complex calibration coefficients.

\* \* \* \* \*